(12) United States Patent
Wakai et al.

(10) Patent No.: US 9,159,868 B2
(45) Date of Patent: *Oct. 13, 2015

(54) METHOD FOR MANUFACTURING SEMICONDUCTOR LIGHT EMITTING DEVICE

(71) Applicant: NICHIA CORPORATION, Anan-shi, Tokushima (JP)

(72) Inventors: Yohei Wakai, Anan (JP); Hiroaki Matsumura, Anan (JP); Kenji Oka, Anan (JP)

(73) Assignee: NICHIA CORPORATION, Anan-Shi, Tokushima (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/470,565
(22) Filed: Aug. 27, 2014
(65) Prior Publication Data

US 2014/0370630 A1    Dec. 18, 2014

Related U.S. Application Data

(60) Division of application No. 14/021,551, filed on Sep. 9, 2013, now Pat. No. 8,883,529, which is a continuation of application No. 12/808,472, filed as application No. PCT/JP2008/073821 on Dec. 26, 2008, now Pat. No. 8,552,445.

(30) Foreign Application Priority Data

Dec. 28, 2007 (JP) ................................ 2007-341111

(51) Int. Cl.
*H01L 33/22* (2010.01)
*H01L 33/00* (2010.01)
(Continued)

(52) U.S. Cl.
CPC ............ *H01L 33/005* (2013.01); *H01L 33/007* (2013.01); *H01L 33/0079* (2013.01);
(Continued)

(58) Field of Classification Search
CPC ... H01L 21/28123; H01L 33/08; H01L 33/20; H01L 33/22
See application file for complete search history.

(56) References Cited

U.S. PATENT DOCUMENTS 5,779,924 A    7/1998   Krames et al.
7,692,203 B2 *  4/2010   Konno et al. .................. 257/96
(Continued)

FOREIGN PATENT DOCUMENTS

EP    1328026 A2    7/2003
EP    1734590 A2    12/2006
(Continued)

OTHER PUBLICATIONS

Korean Office Action Application No. 10-2010-7014047 dated Aug. 8, 2011. per MPEP 609, Copy submitted in parent U.S. Appl. No. 12/808,472.

(Continued)

*Primary Examiner* — Jaehwan Oh
(74) *Attorney, Agent, or Firm* — Squire Patton Boggs (US) LLP

(57) ABSTRACT

A semiconductor light emitting device having high reliability and excellent light distribution characteristics can be provided with an n-electrode arranged on a light extraction surface on the side opposite to the surface whereupon a semiconductor stack is mounted on a substrate. A plurality of convexes are arranged on a first convex region and a second convex region on the light extraction surface. The second convex region adjoins the interface between the n-electrode and the semiconductor stack, between the first convex region and the n-electrode. The base end of the first convex arranged in the first convex region is positioned closer to a light emitting layer than the interface between the n-electrode and the semiconductor stack, and the base end of the second convex arranged in the second convex region is positioned closer to the interface between the n-electrode and the semiconductor stack than the base end of the first convex.

12 Claims, 12 Drawing Sheets

(51) Int. Cl.
*H01L 33/20* (2010.01)
*H01L 33/36* (2010.01)
*H01L 33/44* (2010.01)

(52) U.S. Cl.
CPC ............... *H01L33/20* (2013.01); *H01L 33/22* (2013.01); *H01L 33/36* (2013.01); *H01L 33/44* (2013.01); *H01L 2933/0016* (2013.01); *H01L 2933/0058* (2013.01)

(56) References Cited

U.S. PATENT DOCUMENTS

| | | | |
|---|---|---|---|
| 8,097,891 B2* | 1/2012 | Kasahara et al. | 257/98 |
| 8,552,445 B2* | 10/2013 | Wakai et al. | 257/98 |
| 2003/0178626 A1* | 9/2003 | Sugiyama et al. | 257/79 |
| 2005/0118801 A1 | 6/2005 | Aminpur et al. | |
| 2006/0011934 A1* | 1/2006 | Sunachi et al. | 257/99 |
| 2008/0093612 A1* | 4/2008 | Konno et al. | 257/96 |
| 2008/0142814 A1 | 6/2008 | Chu et al. | |
| 2009/0278145 A1* | 11/2009 | Sakai | 257/98 |
| 2010/0155754 A1* | 6/2010 | Kasahara et al. | 257/98 |

FOREIGN PATENT DOCUMENTS

| | | |
|---|---|---|
| JP | S5840872 A | 3/1983 |
| JP | H06334218 A | 12/1994 |
| JP | H0738146 A | 2/1995 |
| JP | 10-200162 A | 7/1998 |
| JP | 11-54769 A | 2/1999 |
| JP | 2000-196152 | 7/2000 |
| JP | 2003-069075 | 3/2003 |
| JP | 2003-188410 A | 7/2003 |
| JP | 2004-119839 A | 4/2004 |
| JP | 2004-356279 A | 12/2004 |
| JP | 2005-005679 | 1/2005 |
| JP | 2005-244201 | 9/2005 |
| JP | 2006-147787 | 6/2006 |
| JP | 2007-067209 | 3/2007 |
| JP | 2007-088277 | 4/2007 |
| JP | 2008-66554 A | 3/2008 |
| KR | 100649767 B1 | 11/2006 |
| WO | 2006/016955 A1 | 2/2006 |

OTHER PUBLICATIONS

J. H. Lee et al., Extraction-efficiency enhancement of InGaN-based vertical LEDs on hemispherically patterned sapphire, phys. stat. sol. (c) 4, No. 7, 2806-2809 (2007) / DOI 10.1002/pssc/200674821. per MPEP 609, Copy submitted in parent U.S. Appl. No. 12/808,472.
Supplementary European Search Report dated Aug. 6, 2014, issued in corresponding European Application No. EP08867680, 7 pages. per MPEP 609, Copy submitted in parent U.S. Appl. No. 14/021,551.

* cited by examiner

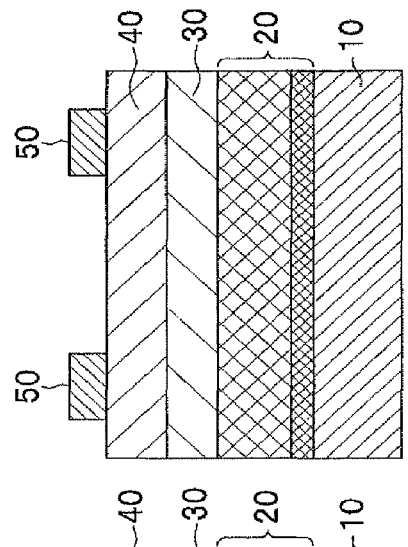
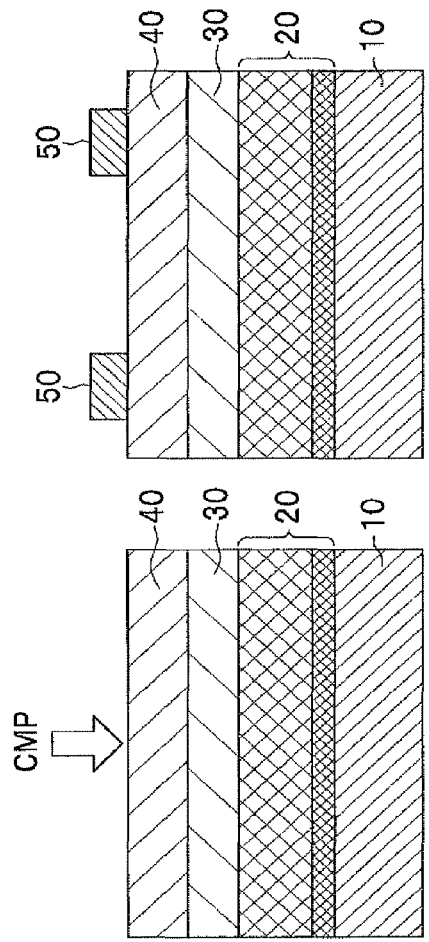
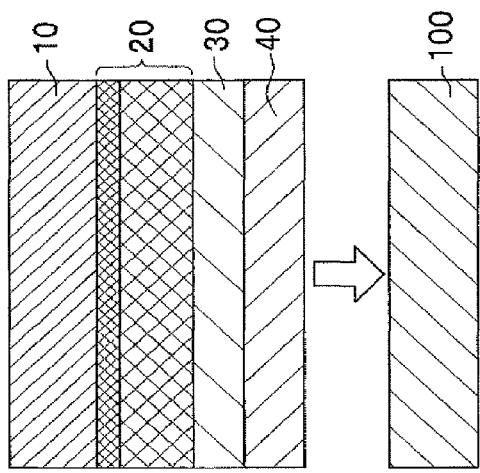
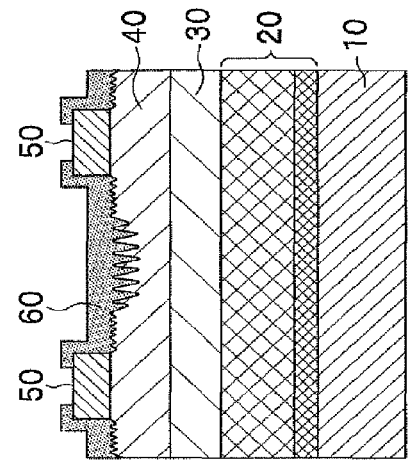
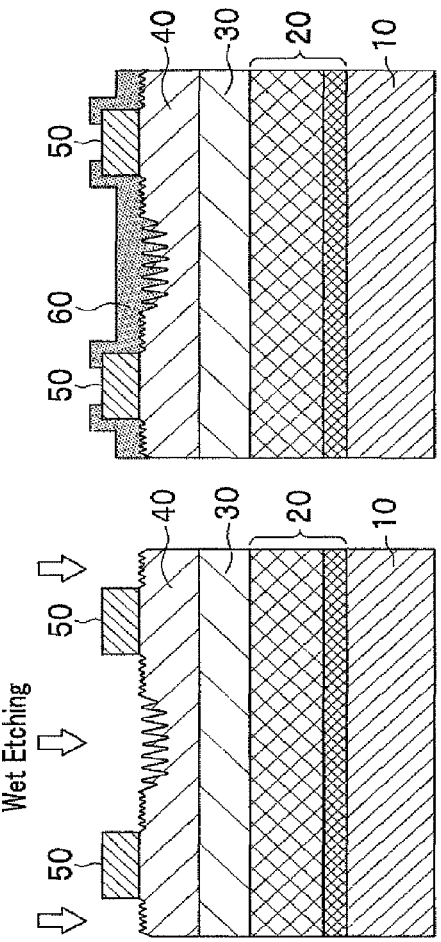
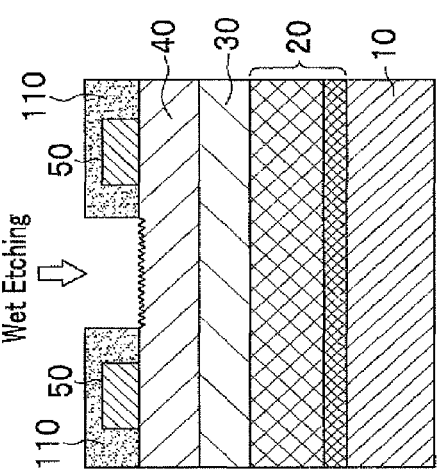

METHOD FOR MANUFACTURING SEMICONDUCTOR LIGHT EMITTING DEVICE

CROSS-REFERENCE TO RELATED APPLICATIONS

This application is a divisional of U.S. patent application Ser. No. 14/021,551 filed on Sep. 9, 2013, which is a continuation of U.S. patent application Ser. No. 12/808,472 filed on Jun. 16, 2010, (now U.S. Pat. No. 8,552,445, issued Oct. 8, 2013) which is a 371 of International Patent Application No. PCT/JP2008/073821 filed on Dec. 26, 2008, and claims the benefit of priority from Japanese Patent Application No. 2007-341111 filed on Dec. 28, 2007. The subject matter of the earlier filed applications is hereby incorporated herein by reference in their entireties.

FIELD OF THE INVENTION

The present invention relates to a semiconductor light emitting device, and more particularly relates to a semiconductor light emitting device which is provided with concaves/convexes on a light extraction surface for increasing light extraction efficiency, and a fabrication method for the same.

DESCRIPTION OF THE RELATED ART

Conventionally, in the light emitting device such as LED, a plurality of concaves/convexes may be formed on a semiconductor layer surface of the light extraction side for increasing light extraction efficiency from the semiconductor layer, and the electrode is also formed on a part of the semiconductor layer surface. Such technologies described in, for example, JPn. Pat. Appln. KOKAI Publication No. 2000-196152, JPn. Pat. Appln. KOKAI Publication No. 2005-5679, JPn. Pat. Appln. KOKAI Publication No. 2003-69075, JPn. Pat. Appln. KOKAI Publication No. 2005-244201 and JPn. Pat. Appln. KOKAI Publication No. 2006-147787 have been known.

In the light emitting device described in JPn. Pat. Appln. KOKAI Publication No. 2000-196152, many hemispherical concaves/convexes are formed spaced to each other on a semiconductor layer surface of the light extraction side, a transparent electrode is formed on the concaves/convexes and a bonding pad is selectively stacked on the transparent electrode. A method for forming the concaves/convexes is as follows. Namely, a plurality of aligned resists which are spaced a predetermined distance to each other are softened and melted by a heat treatment, then, the resists distorted into a hemispherical shape which has a semicircular shape in cross section is transferred to a semiconductor layer surface of the light extraction side to form the concaves/convexes.

In the light emitting device described in JPn. Pat. Appln. KOKAI Publication No. 2005-5679, concaves/convexes having a two-dimensional periodic structure are formed on a semiconductor layer surface of the light extraction side by etching. In the area that has no concaves/convexes on the light extraction side, an n-electrode and a p-electrode are formed in respective different levels with a step.

The light emitting device described in JPn. Pat. Appln. KOKAI Publication No. 2003-69075 is fabricated by stacking a GaN-based compound semiconductor on a GaN-based compound semiconductor substrate, and concaves/convexes are formed, by etching, on a surface opposite to a surface on which a device fabricated on a GaN-based semiconductor substrate is stacked. Electrodes are formed on the concaves/convexes.

The light emitting device described in JPn. Pat. Appln. KOKAI Publication No. 2005-244201 includes a porous structure provided with many long voids and an electrode surrounding the porous structure on a semiconductor layer surface of the light extraction side. A method for forming the porous structure is as follows. Namely, an n-type semiconductor layer, an active layer, a p-type electron barrier layer, a p-type strained superlattice layer and a p-contact layer are formed in this order on a sapphire wafer substrate. After an ohmic p-electrode is formed so as to form a periphery of a light extraction portion having an opening shape, the wafer that stacks each semiconductor layer is dipped in a chemical solution. Then, the porous structure is formed in the light extraction portion of the p-contact layer. In this case, the ohmic p-electrode remains in the periphery portion surrounding the porous structure. Meanwhile, after forming the porous structure, the n-electrode is formed by etching.

The light emitting device described in JPn. Pat. Appln. KOKAI Publication No. 2006-147787 is provided with concaves/convexes which are naturally formed originating from a threading dislocation produced in an interface of the substrate when the crystal is grown, and an electrode is formed on the concaves/convexes.

In addition, in a light emitting device provided with concaves/convexes on a surface of the light extraction side, a light emitting device that has a p-electrode and an n-electrode on the side opposite to a surface of the light extraction side is described in JPn. Pat. Appln. KOKAI Publication No. 2007-88277. The light emitting device described in JPn. Pat. Appln. KOKAI Publication No. 2007-88277 is fabricated by stacking a semiconductor including a light emitting layer on a sapphire substrate, and includes convexes on a surface (surface on light extraction side) opposite to a surface on which the light emitting layer is formed on the sapphire substrate. The convexes are formed using a pattern, and consist of a mixture of a first convex which has a long periodic distance and is relatively high and a second convex which has a short periodic distance and is relatively low.

Meanwhile, a light emitting device that is supposed to have concaves/convexes on a surface of a nitride-based semiconductor layer just under the electrode is described in JPn. Pat. Appln. KOKAI Publication No. 2007-67209. The light emitting device described in JPn. Pat. Appln. KOKAI Publication No. 2007-67209 is fabricated by stacking a gallium nitride-based compound semiconductor on a gallium nitride substrate, and the concaves/convexes are formed on a surface opposite to a surface on which a device on the gallium nitride substrate is stacked. A method for forming the concaves/convexes is as follows. Namely, after macro concaves/convexes are formed by grinding, micro concaves/convexes are formed to be overlapped on the macro concaves/convexes by etching. This improves adhesiveness and contact resistance between the nitride semiconductor and the electrode to be stacked thereon.

However, there were the following problems in the conventional technologies.

The conventional technologies are technologies to dispose concaves/convexes for increasing light extraction efficiency from a semiconductor layer. Therefore, in the case that improves a light output as well as the light extraction efficiency, the following problems will be caused.

For example, in the case that increases a light output by disposing convexes on a semiconductor layer surface, the light output is likely to be increased as the convexes become higher. In other words, the light output is likely to be increased as the semiconductor surface is dug (shaved or etched) deeper.

On the other hand, in the light emitting devices described in JPn. Pat. Appln. KOKAI Publication No. 2000-196152, JPn. Pat. Appln. KOKAI Publication No. 2005-5679, JPn. Pat. Appln. KOKAI Publication No. 2003-69075, JPn. Pat. Appln. KOKAI Publication No. 2005-244201 and JPn. Pat. Appln. KOKAI Publication No. 2006-147787, concaves/convexes are uniformly disposed on a semiconductor layer surface of the light extraction side. Therefore, as the semiconductor layer surface is dug deeper for increasing a light output, the electrode is more likely to be peeled off. For example, in a light emitting device that separates an area for the electrode from an area for the convex, it is required to dispose deep concaves/convexes in the area close to the electrode in the case that increases the light output as well as the light extraction efficiency, and thereby the electrode is likely to be peeled off. Therefore, in the case that increases the light output, while supposing to increase the light extraction efficiency, a highly reliable light emitting device which can prevent the electrode formed on a surface of the light extraction side from peeling-off is expected.

In addition, a control of a light distribution of a light emitting device is important in designing the light emitting device. For example, the light emitting device described in JPn. Pat. Appln. KOKAI Publication No. 2000-196152 is poor in the light distribution because concaves/convexes formed on a semiconductor layer surface are formed in semispherical. That is, a light extraction efficiency of a light emitted outside from the concaves/convexes in the right upper direction becomes poor. Therefore, a technology not to degrade the light distribution when the light output is increased is expected.

The present invention has been developed in consideration of the foregoing problems, and it is an object of the present invention to provide a semiconductor light emitting device which is highly reliable and excellent in light distribution.

It is another object of the present invention to provide a method for fabricating a semiconductor light emitting device which is highly reliable and excellent in light distribution.

DISCLOSURE OF THE INVENTION

According to a first aspect of the present invention, there is provided a semiconductor light emitting device comprising a semiconductor stack including a light emitting layer between an n-type semiconductor layer and a p-type semiconductor layer, a substrate on which the semiconductor stack is mounted, an electrode disposed on a light extraction surface opposite to a surface that the semiconductor stack is mounted on the substrate, and a plurality of convexes on the light extraction surface, in which the plurality of the convexes are disposed in a first convex area and a second convex area, the second convex area is located between the first convex area and the electrode and is adjacent to an interface between the electrode and the semiconductor stack, a base end of a first convex disposed in the first convex area is located to be closer to the light emitting layer than the interface, and a base end of a second convex disposed in the second convex area is located to be closer to the interface than the base end of the first convex.

In the configuration described above, the semiconductor light emitting device is provided with the first convex area and the second convex area in the light extraction surface, and the second convex area is disposed adjacent to the electrode. Therefore, a peeling-off of the electrode of the light emitting device can be reduced in comparison with that of a light emitting device which is uniformly provided with only the first convex which is formed from a relatively deep level on the light extraction surface, while homogenizing a current dispersion in the semiconductor layer. In addition, a light distribution of the semiconductor light emitting device can be improved in comparison with that of a semiconductor light emitting device which is uniformly provided with only the first convex which is formed from a relatively deep level in the light extraction surface, as well as provided with no concaves/convexes in an area adjacent to the electrode. Furthermore, a light output of the semiconductor light emitting device can be increased in comparison with that of a semiconductor light emitting device which is uniformly provided with only the second convex which is formed from a relatively shallow level in the light extraction surface.

In addition, in the semiconductor light emitting device according to the present invention, it is preferable that a height from the base end to a top end of the first convex is larger than a height from the base end to atop end of the second convex. In the configuration, the light extraction surface is provided with the first convex area where the convex is formed to be high from a relatively deep level and the second convex area where the convex is formed to be low from a relatively shallow level, and the second convex area is arranged adjacent to the electrode. Therefore, due to the configuration described above, the peeling-off of the electrode can be reduced and the light distribution of the semiconductor light emitting device can be improved. Here, it is preferable that a height of the first convex is more than twice of that of the second convex.

In addition, in the semiconductor light emitting device according to the present invention, it is preferable that the top end of the first convex and the top end of the second convex are tapered off to a point. In the configuration, a light extraction efficiency in the right above direction of a light emitted outside from the first convex and the second convex is improved. Then, the light distribution can be improved in comparison with the case that the top end is not tapered off to a point.

In addition, the semiconductor light emitting device according to the present invention may be configured in such a manner that at least the second convex area is disposed so as to surround the electrode. In the configuration, the light distribution is improved in comparison with the case that the second convex area is adjacent to only a part of the electrode. In addition, a degree of freedom in designing an electrode shape and an arrangement position thereof in the light extraction surface can be increased. Here, it is sufficient as long as the second convex area surrounds at least the electrode, and, for example, the second convex area may be disposed at an outer periphery of the first convex area, while surrounding the electrode.

In addition, in the semiconductor light emitting device according to the present invention, it is preferable that the first convex area is disposed so as to surround the second convex area and the electrode. In the configuration, the first convex area is arranged apart from the electrode and in high density, thereby resulting in high light output.

In addition, the semiconductor light emitting device according to the present invention may be configured in such a manner that the electrodes are disposed on the light extraction surface apart from each other, and the first convex area and the second convex area are disposed in an area between the electrodes. In the configuration, when a plurality of electrodes are disposed on the light extraction surface apart from each other at a predetermined distance, each electrode can be prevented from peeling-off, and the light distribution can be improved.

In addition, in the semiconductor light emitting device according to the present invention, it is preferable that the top end of the first convex and the top end of the second convex are formed in a non-flat shape. In the configuration, the light distribution can be improved in comparison with the case that the top end is a flat shape. Here, the non-flat top end includes a top end having a curved surface, a pointed top end, and a top end having concaves/convexes at the top.

In addition, in the semiconductor light emitting device according to the present invention, it is preferable that a base end of the first convex is disposed adjacent to a base end of an adjacent first convex, and a base end of the second convex is disposed adjacent to a base end of an adjacent second convex. In the configuration, the light extraction efficiency in the right above direction of a light emitted outside from the convexes can be increased in comparison with the case that has spaces of flat surfaces among base ends of adjacent convexes. Then, the light distribution is improved. In addition, neighboring of base ends of adjacent convexes corresponds to the status that a surface which has spaces among base ends of adjacent convexes is further deeply etched, thereby resulting in increase in the light output.

In addition, the semiconductor light emitting device according to the present invention may be configured in such a manner that the base end of the first convex in the first convex area is formed to be closer to the light emitting layer as the first convex leaves the electrode. In the configuration, the convex is deepened with two steps in the light extraction surface. The convex in the first convex area is formed to be deeper than that of the second convex area which is disposed closer to the electrode than the first convex area, and even in the first convex area, the convex is formed to become gradually or continuously deeper as the convex leaves the electrode. As a result, the light output can be increased, while reducing the peeling-off of the electrode.

In addition, the semiconductor light emitting device according to the present invention may be configured in such a manner that a third convex is further disposed in the interface between the electrode and the semiconductor stack. In the configuration, in addition to that the light output can be increased, a contact resistance between the third convex and the electrode which is stacked on the third convex after the third convex is formed on the surface of the light extraction side of the semiconductor stack, and the adhesiveness between the surface of the light extraction side and the electrode can be improved. Here, the third convex may have a shape and a size identical to those of the first convex or the second convex, and further, may have a shape and a size different from those of the first convex and the second convex.

According to a second aspect of the present invention, there is provided a method for fabricating a semiconductor light emitting device comprising steps for forming a semiconductor stack including a light emitting layer between an n-type semiconductor layer and a p-type semiconductor layer, for forming a resist having an opening surrounding an electrode formation planned area on a semiconductor layer surface which forms a light extraction surface opposite to a surface that the semiconductor stack is mounted on a substrate in such a manner that the opening is narrowed toward a stacking direction of the resist, for stacking a mask material on the semiconductor layer surface through the resist, for removing the resist on which the mask material is stacked, and for etching the semiconductor layer surface by masking the electrode formation planned area.

According to the procedure described above, the method for fabricating a semiconductor light emitting device includes a step for forming the resist having the opening which is narrowed toward the stacking direction of the resist. Therefore, if a mask material is stacked on the semiconductor layer surface through the resist formed as described above, the mask material injected through the opening is slightly spread on the side of the resist on the semiconductor layer surface, and forms a guard-shaped area which is wider than the opening. Then, when the resist on which the mask material is stacked is removed, the mask material having a cross section identical to a shape of the opening of the resist remains in the electrode formation planned area on the semiconductor layer surface. In addition, a thin guard-shaped area made of the mask material is formed so as to surround the electrode formation planned area. Next, when the semiconductor layer surface is etched by masking the electrode formation planned area, the convex is formed early in the area that has no mask material. In this case, in the guard-shaped area, the thin mask material is gradually removed and the semiconductor is exposed, and finally, the convex is formed late. Through the processes described above, two types of convexes having different heights can be formed. Then, it is unnecessary to etch twice for forming the two types of convexes, and the fabrication process can be shortened, accordingly.

In addition, in the method for fabricating a semiconductor light emitting device according to the present invention, it is preferable to further comprise a step for using an electrode material as the mask material. In the procedure, the method for fabricating a semiconductor light emitting device includes the step for removing the resist on which the electrode material as a mask material is stacked. Therefore, the electrode having a cross section identical to a shape of the opening of the resist can be formed by the step in the electrode formation planned area on the semiconductor layer surface, and accordingly, the fabrication process can be shortened.

According to the semiconductor light emitting device of the present invention, a peeling-off of the electrode on the side of the light extraction surface can be reduced, and a current dispersion in the semiconductor layer can be homogenized, while increasing the light extraction efficiency. Then, a semiconductor light emitting device which is highly reliable and excellent in light output can be provided. In addition, the light output has a maximum value at directivity angle 0°, and the light distribution is close to the Lambert's law. Therefore, a semiconductor light emitting device suitable for, for example, lighting can be provided. In addition, according to the present invention, a semiconductor light emitting device which is highly reliable and excellent in light distribution can be fabricated, while shortening the fabrication process. Here, the excellent light distribution in the present invention means that the light output has the maximum value at directivity angle 0°, and the light distribution is close to the Lambert's law. As a result, a light emitting device which is excellent and easy in designing of, for example, lighting or an automobile headlamp can be obtained.

BRIEF DESCRIPTION OF THE DRAWINGS

FIG. 6A to FIG. 6F are cross sectional views schematically showing the fabrication process of the semiconductor light emitting device shown in FIG. 1 (Part 2);

BEST MODE FOR EMBODYING THE INVENTION

Figure 1:
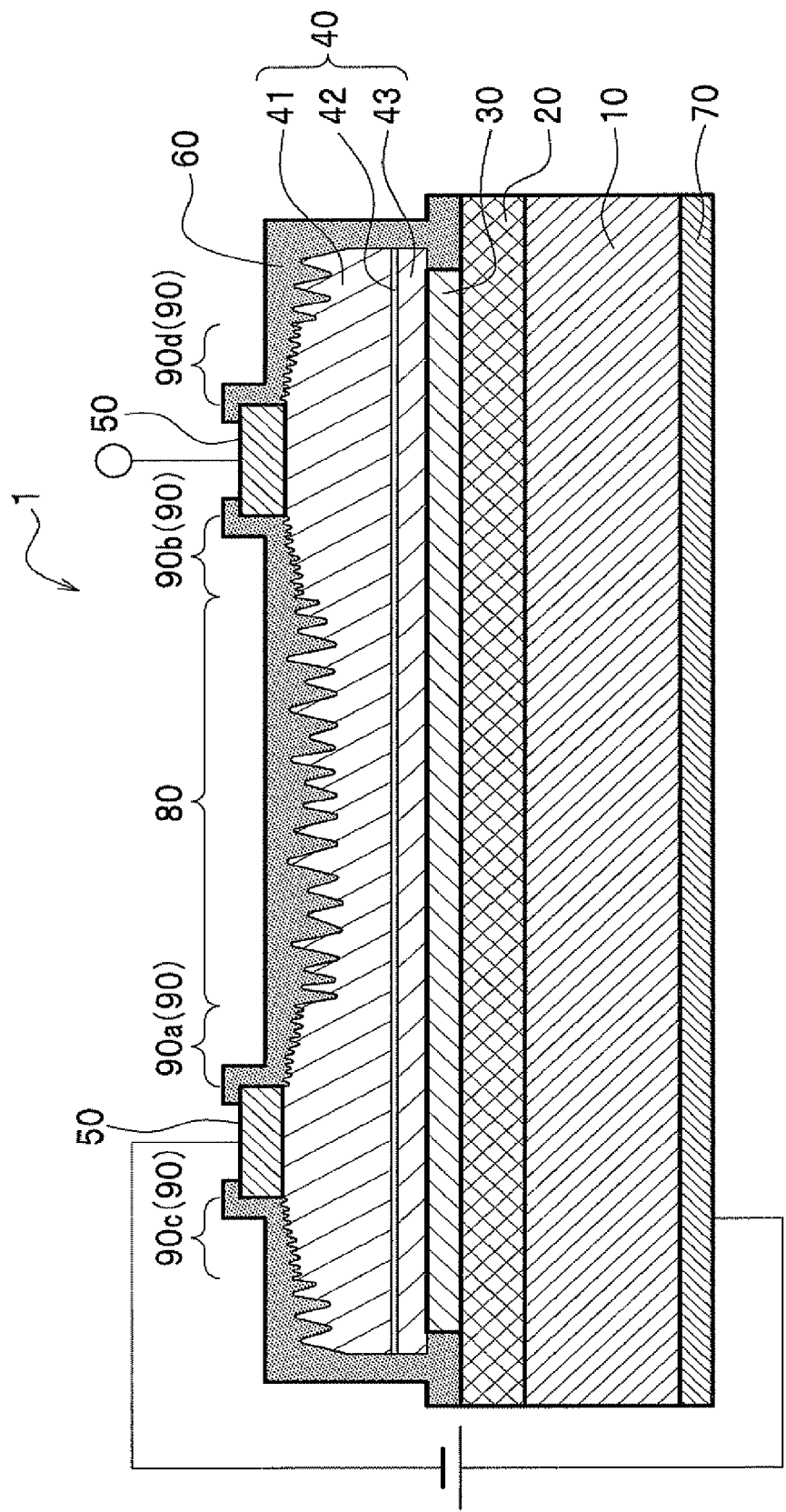
FIG. 1 is a cross sectional view schematically showing a structure of a semiconductor light emitting device according to an embodiment of the present invention.

Hereinafter, a best mode (hereinafter, referred to as embodiment) for embodying a semiconductor light emitting device according to the present invention will be explained by referring to drawings. It is noted that thicknesses and lengths of, for example, constituents shown in the drawings are enlarged for the purpose of clearly explaining the arrangements, then, the thicknesses and lengths are not limited to those shown in the drawings.

[Structure of Light Emitting Device]

Figure 2:
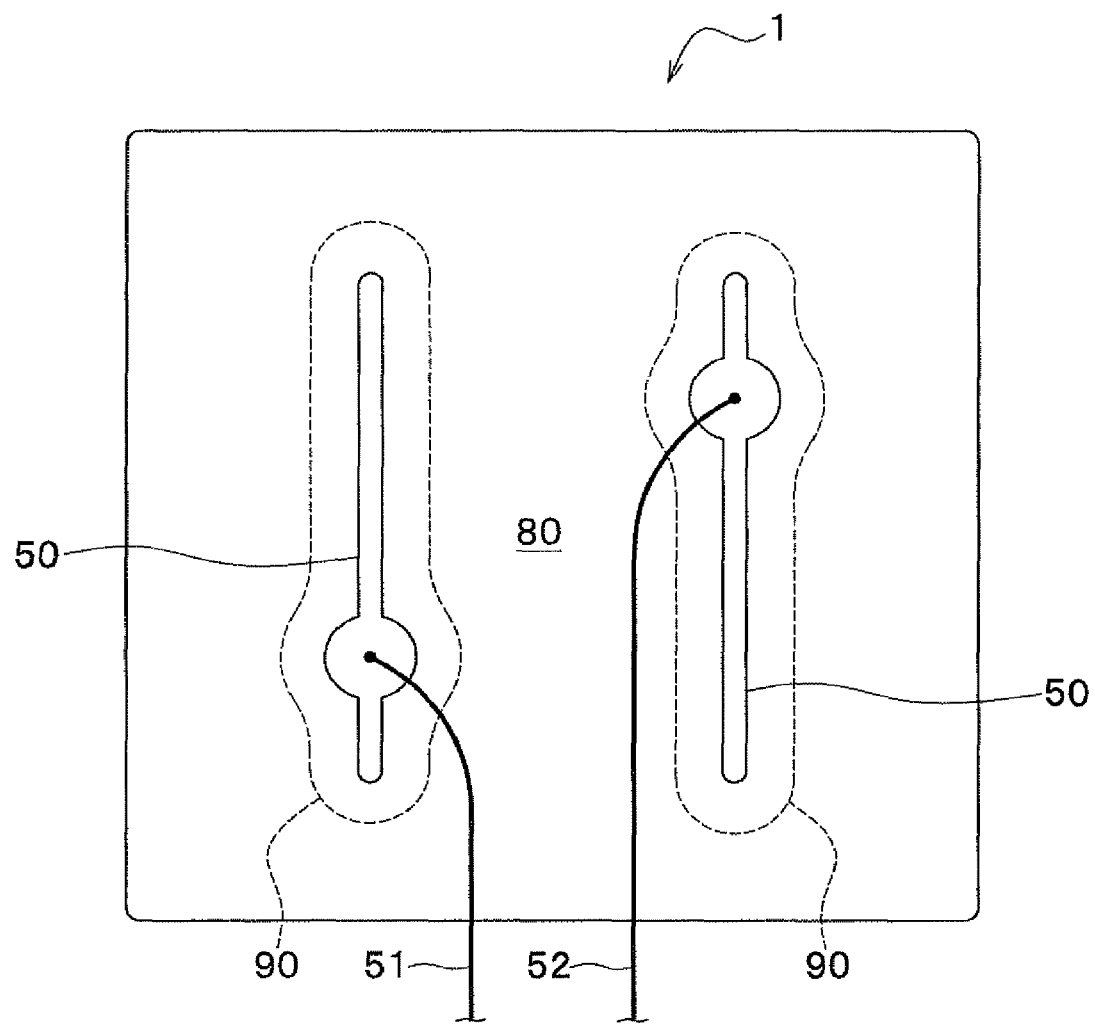
FIG. 2 is a plan view showing an example of an n-electrode shown in FIG. 1.
Figure 3:
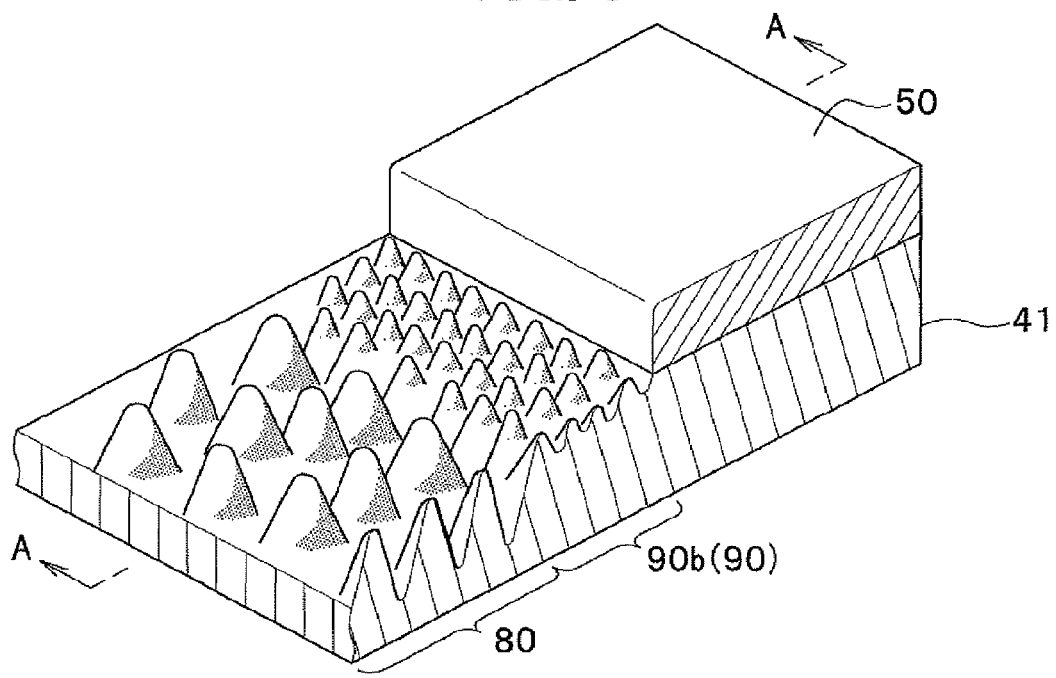
FIG. 3 is a perspective view schematically showing a first convex area and a second convex area shown in FIG. 1.
Figure 4:
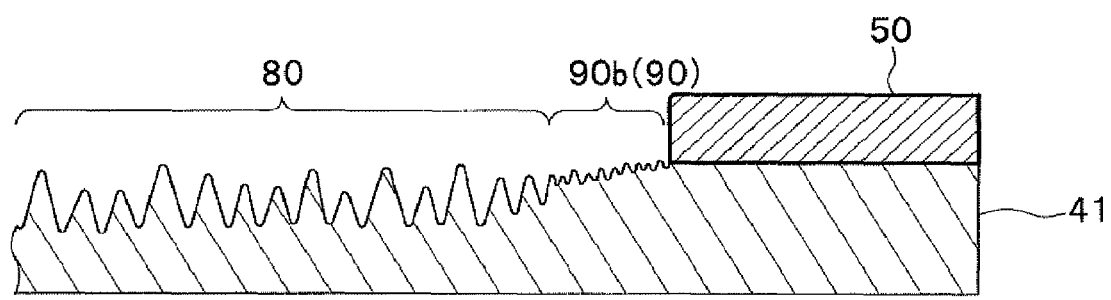
FIG. 4 is a cross sectional view taken along A-A line shown in FIG. 3.

A light emitting device according to an embodiment of the present invention relates to a light emitting device which is provided with a plurality of convexes and an electrode on a light extraction surface of a semiconductor stack, which has a light emitting layer between an n-type semiconductor layer and a p-type semiconductor layer, opposite to the surface to be mounted on a substrate. First, a structure of the semiconductor light emitting device will be explained by referring to FIG. 1 to FIG. 4. FIG. 1 is a cross sectional view schematically showing a structure of a semiconductor light emitting device according to the embodiment of the present invention, and FIG. 2 is a plan view showing an example of an n-electrode shown in FIG. 1. In addition, FIG. 3 is a perspective view schematically showing a first convex area and a second convex area shown in FIG. 1, and FIG. 4 is a cross sectional view taken along A-A line shown in FIG. 3.

As shown in FIG. 1, a semiconductor light emitting device 1 according to the embodiment mainly consists of a substrate 10, a metallization layer 20, a p-electrode 30, a semiconductor stack 40, an n-electrode 50, a passivation film 60 and a backside metallization layer 70.

(Substrate)

The substrate 10 is made of silicon (Si). Meanwhile, other than Si, for example, a semiconductor substrate made of a semiconductor such as Ge, SiC, GaN, GaAs, GaP, InP, ZnSe, ZnS and ZnO, or a single metal substrate, or a metal substrate made of a complex of metals which consists of not less than two metals which are mutually immiscible or have a small solid solubility limit to each other may be used. As the single metal substrate, specifically, a Cu substrate can be used. In addition, as the metal substrate, specifically, a substrate consisting of at least one metal selected from a highly-conductive metal such as Ag, Cu, Au and Pt and at least one metal selected from a high hardness metal such as W, Mo, Cr and Ni may be used. When the substrate 10 which is made of a semiconductor material is used, a device, for example, a zener diode may be added to the substrate 10. Further, as the metal substrate, a complex of Cu—W or Cu—Mo may be preferably used.

(Metallization Layer)

A metallization layer 20 is a eutectic alloy for bonding two substrates in the fabrication process of the semiconductor light emitting device 1. Specifically, a metallization layer 21 on the epitaxial (growth) side shown in FIG. 5C and a metallization layer 22 on the substrate side shown in FIG. 5D are bonded to form the metallization layer 20. The metallization layer 21 on the epitaxial side may be formed by stacking, for example, Ti/Pt/Au/Sn/Au in this order from the bottom in FIG. 5C. In addition, the metallization layer 22 on the substrate side may be formed by stacking, for example, Au/Pt/TiSi$_2$, or TiSi$_2$/Pt/Pd in this order from the top in FIG. 5D. Returning to FIG. 1, the explanation for the structure of the semiconductor light emitting device 1 will be continued.

(p-Electrode)

A p-electrode 30 is formed on a mounting surface of a semiconductor stack 40 on the side of the substrate 10.

Specifically, the p-electrode 30 consists of at least two layers, that is, a p-electrode first layer (not shown) on the side of the semiconductor stack 40 and a p-electrode second layer (not shown) on the bottom side of the p-electrode first layer.

The following materials are commonly used for the p-electrode first layer (not shown). For example, a metal such as Ag, Zn, Ni, Pt, Pd, Rh, Ru, Os, Ir, Ti, Zr, Hf, V, Nb, Ta, Co, Fe, Mn, Mo, Cr, W, La, Cu and Y, and an alloy thereof, and a single film or a stacked film of, for example, conductive oxides such as ITO, ZnO and SnO$_2$ may be used. With respect to the p-electrode second layer (not shown), for example, Pt, Au and Ni—Ti—Au based electrode material may be used.

Specifically not shown, but if the p-electrode 30 consists of a two-layer structure of the p-electrode first layer/the p-electrode second layer, a stacked layer structure of, for example, Pt/Au, Pd/Au, Rh/Au and Ni/Au may be used. In addition, if the p-electrode 30 consists of a three-layer structure including a p-electrode third layer between the p-electrode first layer and the p-electrode second layer, a stacked layer structure of, for example, Ni/Pt/Au, Pd/Pt/Au and Rh/Pt/Au may be used. Furthermore, if the p-electrode 30 consists of a four-layer structure including the p-electrode third layer and a p-electrode fourth layer between the p-electrode first layer and the p-electrode second layer, a stacked layer structure of, for example, Ag/Ni/Ti/Pt may be used.

(Semiconductor Stack)

The semiconductor stack 40 is made of, for example, GaN-based compound semiconductor which is generally expressed by In$_x$Al$_y$Ga$_{1-x-y}$N ($0 \leq x \leq 1$, $0 \leq y \leq 1$, $0 \leq x+y \leq 1$). Specifically, the GaN-based compound semiconductor is, for example, GaN, AlGaN, InGaN and AlGaInN. Especially, GaN is preferable because an etched surface of GaN has an excellent crystalline surface. The semiconductor stack 40 is formed by sequentially stacking an n-type semiconductor layer 41, a light emitting layer 42 and a p-type semiconductor layer 43 in this order from the side of the light extraction surface opposite to a surface of the semiconductor stack 40 to be mounted on the substrate 10.

A plurality of convexes are formed on the light extraction surface. In the embodiment, the light extraction surface is a surface of the n-type semiconductor layer 41. That is, the plurality of convexes are disposed on the n-type semiconductor layer 41. The plurality of convexes are disposed in a first convex area 80 and a second convex area 90 (90a, 90b, 90c, 90d). The second convex area 90 is located between the first convex area 80 and the n-electrode 50, and neighbored an interface between the n-electrode 50 and the semiconductor stack 40. A base end of the first convex formed in the first convex area 80 is located at a position closer to the light emitting layer 42 than the interface between the n-electrode 50 and the semiconductor stack 40. A base end of the second convex formed in the second convex area 90 is located at a position closer to the interface between the n-electrode 50 and the semiconductor stack 40 than the base end of the first convex. A height of the first convex from the base end to the top end is larger than that of the second convex. Two n-electrodes 50 are disposed on the light extraction surface spaced to each other, and the first convex area 80 and the second convex areas 90a, 90b exist in an area between the two n-electrodes 50 which are disposed spaced to each other. The convexes (first convex, second convex) formed in the first convex area 80 and the second convex area 90 will be explained later in detail.

The n-type semiconductor layer 41 is made of GaN containing, for example, Si, Ge or O (oxygen) as an n-type impurity. The n-type semiconductor layer 41 may be formed by a plurality of layers.

The light emitting layer 42 is made of, for example, InGaN.

The p-type semiconductor layer 43 is made of GaN containing, for example, Mg as a p-type impurity.

Two electrodes are formed on the light extraction surface of the semiconductor stack 40. In the embodiment, since the light extraction surface is a surface of the n-type semiconductor layer 41, an electrode formed on the light extraction surface is the n-electrode 50. Meanwhile, a number of the electrode to be formed on the light extraction surface may be one or more.

(n-Electrode)

As shown in FIG. 1, the n-electrodes 50 are disposed on the light extraction surface at a predetermined distance. In the embodiment, since the light extraction surface is a surface of the n-type semiconductor layer 41, the n-electrodes 50 are formed on an upper surface of the n-type semiconductor layer 41 at a predetermined distance and electrically connected. The n-electrode 50 is connected to the outside by a bonding wire. The n-electrode 50 consists of a multilayer film including a plurality of metals, for example, Ti/Pt/Au, Ti/Pt/Au/Ni, Ti/Al, Ti/Al/Pt/Au, W/Pt/Au, V/Pt/Au, Ti/TiN/Pt/Au and Ti/TiN/Pt/Au/Ni in this order from the upper side of the n-type semiconductor layer 41. The metals are stacked in these orders from the upper side of the n-type semiconductor layer 41. Meanwhile, the n-electrode 50 may be consisting of an ohmic electrode and a pad electrode.

In an example shown in FIG. 2, two n-electrodes 50 having approximately a line shape are disposed parallel in the semiconductor light emitting device 1 at a predetermined distance, and wires 51, 52 are connected to the respective n-electrodes 50. The second convex area 90 is disposed surrounding the n-electrode 50. For example, the n-electrode 50 to which the wire 51 is connected corresponds to the electrode surrounded by the second convex areas 90a, 90c shown in FIG. 1. Similarly, the n-electrode 50 to which the wire 52 is connected corresponds to the electrode surrounded by the second convex areas 90b, 90d shown in FIG. 1. Here, as shown in FIG. 2, the second convex areas 90a, 90c shown in FIG. 1 are the areas that are given two numerical numbers to the unique second convex area 90 for convenience. This is the same with the second convex areas 90b, 90d shown in FIG. 1. In addition, the first convex area 80 is disposed surrounding the second convex area 90 and the n-electrode 50. Namely, the first convex area 80 surrounds one n-electrode 50 to which the wire 51 is connected and the second convex area 90 surrounding the one n-electrode 50, and the other n-electrode 50 to which the wire 52 is connected and the second convex area 90 surrounding the other n-electrode 50.

Returning to FIG. 1, the explanation for the structure of the semiconductor light emitting device 1 will be continued.

(Passivation Film)

A passivation film 60 is made of a transparent material which has a refractive index lower than that of the n-type semiconductor layer 41, and covers a surface of an upper surface of the n-electrode 50 except the wire bonding area and a surface as well as a side face of the n-type semiconductor layer 41. The passivation film 60 is made of an insulator film, and preferably made of an oxide film. The passivation film 60 is made of, for example, $SiO_2$ or $ZrO_2$.

The passivation film 60 may be formed by a well known method, such as sputtering, ECR (Electron Cyclotron Resonance) sputtering, CVD (Chemical Vapor Deposition), ECR-CVD, ECR-plasma CVD, evaporation and EB (Electron Beam). The passivation film 60 is preferably formed by, for example, ECR sputtering, ECR-CVD and ECR-plasma CVD.

(Backside Metallization Layer)

A backside metallization layer 70 is formed on a surface of the substrate 10 opposite to a surface on which a metallization layer 20 is formed, and functions as an ohmic electrode. As the backside metallization layer 70, for example, a metal stack of $TiSi_2$/Pt/Au, which are sequentially stacked in this order from the upper side in FIG. 1, may be used.

(First Convex Area and Second Convex Area)

As shown in FIG. 3 and FIG. 4, the first convex formed in the first convex area 80 and the second convex formed in the second convex area 90b (90) have a top end that tapers off toward the top end, and a light distribution of the semiconductor light emitting device becomes good by this taper. In addition, the top end of the first convex and the second convex is formed in a curved surface. Therefore, the light distribution is good in comparison with a case where the top end is formed in flat. As shown in FIG. 3 and FIG. 4, a height of the first convex is more than twice of that of the second convex. In addition, a base end of each of the first convex and the second convex is disposed so as to neighbor a base end of the adjacent convex to each other. That is, there is no flat surface between the adjacent convexes (first convex, second convex) to each other. Since the convex is formed in such a high density, the light extraction efficiency can be increased, thereby resulting in good light distribution. Furthermore, if a depth of the convex is the same, the forgoing case that has no flat surface between the convexes has a high light output in comparison with a case having a flat surface between the convexes.

[Fabrication Method of Semiconductor Light Emitting Device]

(First Fabrication Method)

A first fabrication method of a semiconductor light emitting device shown in FIG. 1 will be explained by referring to FIG. 5 and FIG. 6 (see FIG. 1 to FIG. 4 as appropriate). FIG.

5 and FIG. 6 are cross sectional views schematically showing the fabrication method of the semiconductor light emitting device shown in FIG. 1.

Figure 5A:
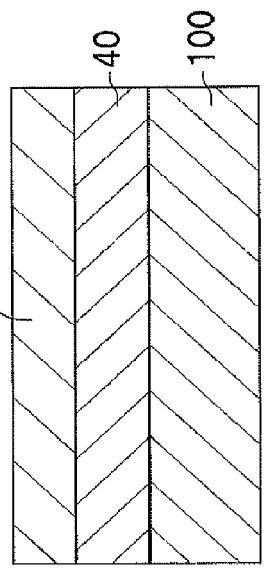
FIG. 5A to FIG. 5E are cross sectional views schematically showing a fabrication process of the semiconductor light emitting device shown in FIG. 1 (Part 1)

First, as shown in FIG. 5A, the n-type semiconductor layer 41, the light emitting layer 42 and the p-type semiconductor layer 43 are stacked in this order on a semiconductor growing substrate 100 to form the semiconductor stack 40. The semiconductor growing substrate 100 is a substrate to be removed in a later process, and made of, for example, sapphire having any one of a C-plane, R-plane and A-plane as a principal plane. Meanwhile, a substrate different from the sapphire substrate may be used for the semiconductor growing substrate 100. As a substrate different from the sapphire substrate, for example, an insulator substrate such as spinel ($MgAl_2O_4$), SiC (including 6H, 4H and 3C), ZnS, ZnO, GaAs and an oxide substrate whose lattice matches with the lattices of nitride semiconductors, which are well known and on which nitride semiconductors can be grown, may be used.

Figure 5B:
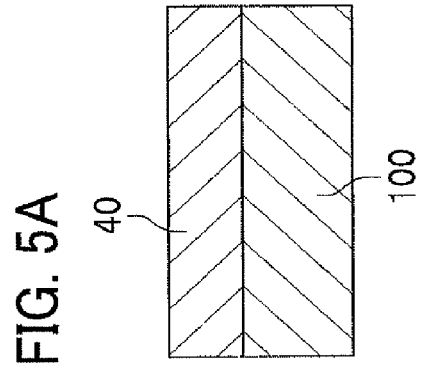
Figure 5E:
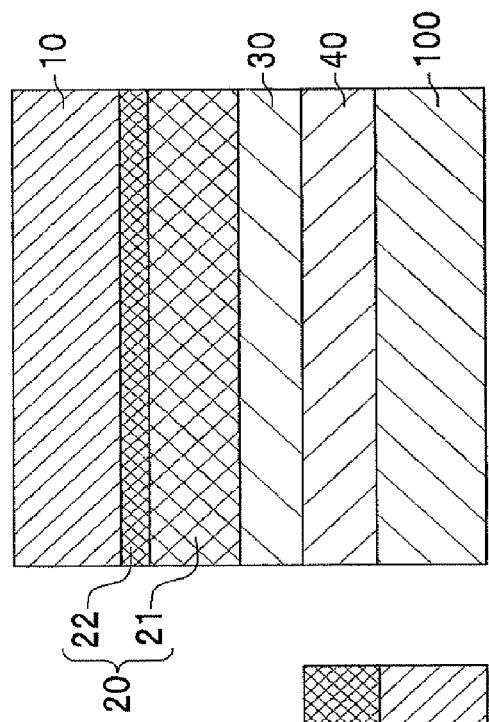
Figure 5D:
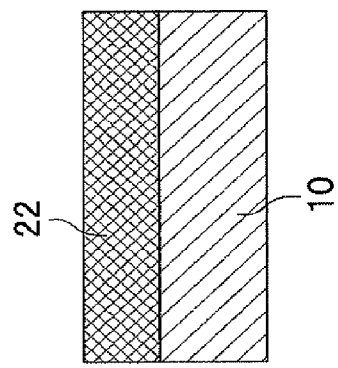
Figure 5C:
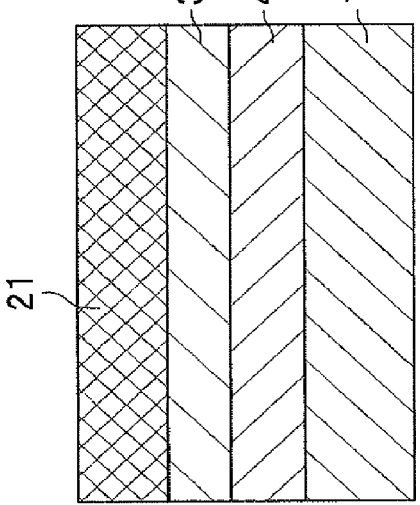

Next, as shown in FIG. 5B, a p-electrode first layer and a p-electrode second layer, which are not shown, are stacked in this order on an upper surface of the semiconductor stack 40 (surface of p-type semiconductor layer 43) to form a p-electrode 30 using magnetron sputtering. Next, as shown in FIG. 5C, a metallization layer 21 on the epitaxial layer side is stacked on the p-electrode 30. In addition, before or after, or in parallel with forming the metallization layer 21, as shown in FIG. 5D, a metallization layer 22 is stacked on the substrate 10. Next, as shown in FIG. 5E, the substrate 10 on which the metallization layer 22 is stacked is turned over, and the metallization layer 22 on the substrate side and the metallization layer 21 on the epitaxial side are bonded to each other.

Next, as shown in FIG. 6A, the semiconductor growing substrate 100 is removed from the semiconductor stack 40. As shown in FIG. 6B, an upper surface (surface of n-type semiconductor layer 41) of the semiconductor stack 40, which is an uppermost surface due to turning over of the substrate 10 from which the semiconductor growing substrate 100 is removed, is polished by CMP (Chemical Mechanical Polishing).

The upper surface (surface of n-type semiconductor layer 41) that is the uppermost surface of the semiconductor stack 40 is a surface of the light extraction surface. Dry-etching and wet-etching both may be used for forming the first convex area 80 and the second convex area 90 on the light extraction surface. However, wet-etching is preferable in order to obtain a top end of the convex having a curved surface and to obtain a structure where base ends of the convexes are arranged close together. Then, a method for forming the convex using wet-etching will be described next. Here, as a solution of wet-etching, a KOH aqueous solution, TMAH (Tetramethyl ammonium hydroxide) and EDP (Ethylene diamine pyrocatechol) may be used as an anisotropic etching solution.

Next, as shown in FIG. 6C, n-electrodes 50 are formed on the upper surface (surface of n-type semiconductor layer 41) of the semiconductor stack 40 at a predetermined distance. Next, as shown in FIG. 6D, a mask 110 which entirely covers an upper surface and a side face of the n-electrodes 50 is disposed, and a non-masked area is etched by wet-etching. The non-masked area is an area to be the first convex area 80, and many imperfect first convexes are formed by the etching. Namely, a low convex projecting from a relatively shallow level is formed. Meanwhile, a working amount (depth) and a height of the convex can be adjusted by changing a temperature and a dipping time of the wet-etching. For example, a temperature of the etching solution may be raised to 50 to 100° C., and the dipping time may be set to, for example, 30 minutes.

Next, the mask 110 is removed, and as shown in FIG. 6E, a non-masked area is wet-etched using the n-electrode 50 as a mask. In an area where the imperfect first convexes were formed within the non-masked area, many first convexes are formed by this etching. Namely, a high convex projecting from a relatively deep level is formed. In addition, in an area where the mask 110 was formed, many second convexes are formed by this etching. Namely, a low convex projecting from a relatively shallow level is formed.

Next, as shown in FIG. 6F, the upper surface (surface of n-type semiconductor layer 41) of the semiconductor stack 40 is covered with a passivation film 60. Meanwhile, the upper surface of the n-electrode 50 except an area for wire bonding and a side face of the semiconductor stack 40 are covered with the passivation film 60. Then, a backside metallization layer 70 is formed as an ohmic electrode on a surface of the substrate 10 which is the uppermost surface due to turning over of the substrate 10, and the wafer on which the light emitting devices are formed is cut into chips. After that, the chip is mounted via the backside metallization layer 70, and a wire is bonded to the n-electrode 50 to fabricate the semiconductor light emitting device 1 shown in FIG. 1.

(Second Fabrication Method)

Figure 7:
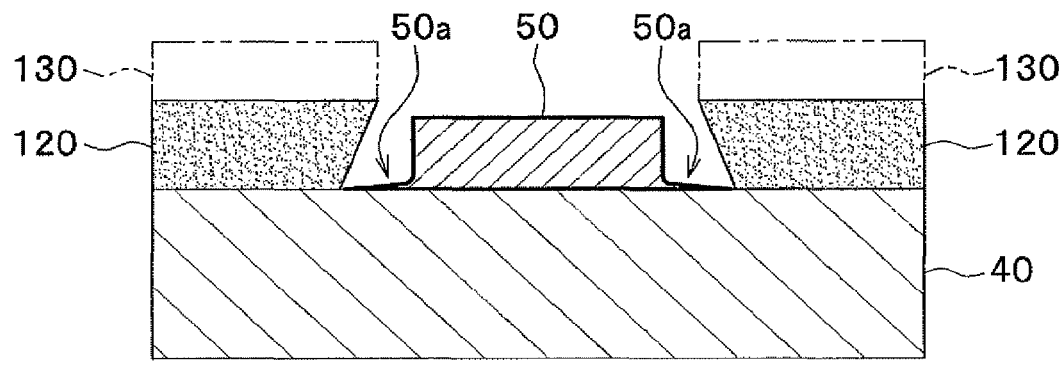
FIG. 7 is a cross sectional view schematically showing the fabrication process of the semiconductor light emitting device shown in FIG. 1 (Part 3)

Each of the processes shown in FIG. 5A to FIG. 5E and FIG. 6A to FIG. 6B is conducted in a second fabrication method of the light emitting device shown in FIG. 1 as with the first fabrication method. The second fabrication method is characterized by a method for forming the n-electrode 50 following the process shown in FIG. 6C. The second fabrication method will be explained by referring to FIG. 7 (see FIG. 1 to FIG. 6F as appropriate). FIG. 7 is a cross sectional view schematically showing a fabrication process of the light emitting device. It is noted that the layers below the semiconductor stack 40 are omitted in the illustration.

As shown in FIG. 7, a resist 120 is disposed on an electrode formation non-planned area of the upper surface (surface of n-type semiconductor layer 41) of the semiconductor stack 40. Here, the resist 120 which has an opening surrounding an electrode formation planned area on the upper surface of the semiconductor stack 40 is formed so as to narrow the opening toward a stacking direction (toward surface) of the resist 120. Next, the upper surface of the semiconductor stack 40 is entirely covered with an electrode material 130 through the resist 120. Therefore, the electrode material 130 which is injected from the opening is slightly spread toward the resist 120 on the upper surface of the semiconductor stack 40, and a guard-shaped area which is wider than the opening is formed. Subsequently, when the resist 120 on which the electrode material 130 is disposed is removed, the n-electrode 50 is formed on the electrode formation planned area. In this case, a guard-shaped portion 50a is formed so as to surround the n-electrode 50.

After that, a non-masked area of the semiconductor stack 40 is etched by wet-etching using the n-electrode 50 (electrode formation planned area) as a mask. Here, a convex is formed earlier in an area where the guard-shaped portion 50a is not formed. In this case, in the area of the guard-shaped portion 50a, the thin electrode is gradually removed, and the upper surface of the semiconductor stack 40 is gradually exposed, and finally, a convex is formed later. As a result, two types of convexes (first convex, second convex) which have different heights to each other can be formed. That is, the area where the guard-shaped portion 50a is not formed becomes the first convex area 80, and the area of the guard-shaped portion 50a becomes the second convex area 90. As a result, since it is unnecessary to etch twice for forming the first convex area 80 and the second convex area 90, the fabrication process can be shortened. Meanwhile, since the processes after the etching are the same with those of the first fabrication method, the explanation will be omitted.

[Characteristics of Semiconductor Light Emitting Device]

With respect to the characteristics of the semiconductor light emitting device 1 according to the embodiment, a light output, an electrode peeling-off rate and a light distribution will be explained.

(Light Output)

The semiconductor light emitting device 1 according to the embodiment is provided with the first convex area 80 having the first convex which is formed from a relatively deep level and relatively high, and the second convex area 90 having the second convex which is formed from a relatively shallow level and relatively low on the light extraction surface. Therefore, the light output of the light emitting device can be increased in comparison with a light emitting device which is provided with only the second convex in a whole area on the light extraction surface. In addition, as will be described later, since the electrode peeling-off rate is low and the light distribution is excellent, the first convex can be formed to be high, and thereby the light output can be increased.

(Electrode Peeling-Off Rate and Light Output)

Figure 12:
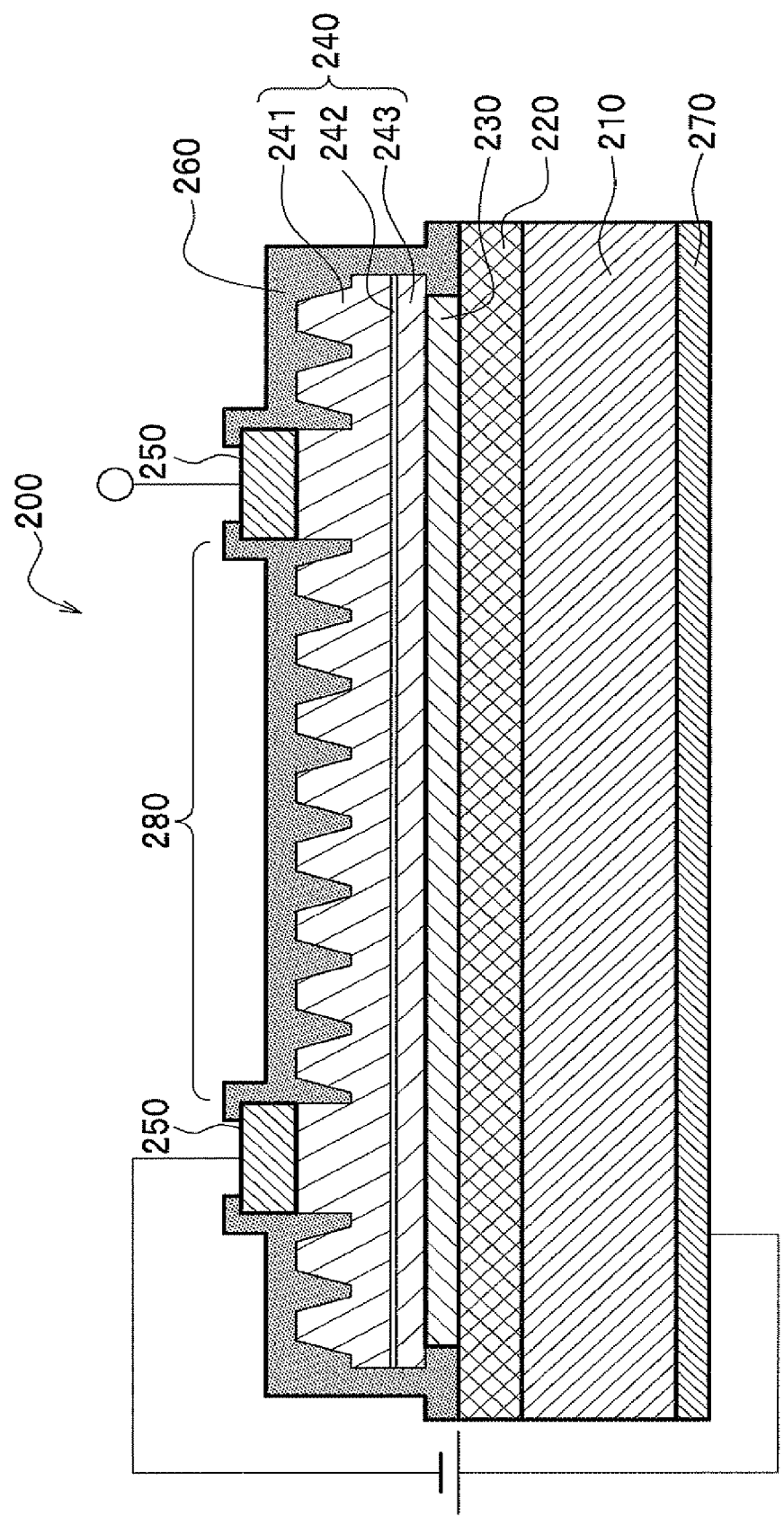
FIG. 12 is a cross sectional view schematically showing a structure of a conventional semiconductor light emitting device.

For comparison, an example (hereinafter, referred to as COMPARATIVE EXAMPLE 1) was fabricated, where the second convex was formed from a relatively deep level as with the first convex and concaves/convexes were formed by dry-etching using RIE (Reactive Ion Etching). As shown in FIG. 12, a conventional semiconductor light emitting device 200 that shows the COMPARATIVE EXAMPLE 1 mainly consists of a substrate 210, a metallization layer 220, a p-electrode 230, a semiconductor stack 240, an n-electrode 250, a passivation film 260 and a backside metallization layer 270. The semiconductor stack 240 is formed by stacking an n-type semiconductor layer 241, a light emitting layer 242 and a p-type semiconductor layer 243 in this order from a side of the light extraction surface which is an opposite surface of the semiconductor stack 240 to be mounted on the substrate 210. In addition, concaves/convexes 280 are regularly formed in an electrode formation non-planned area on the surface of the n-type semiconductor layer 241. The n-electrode 250 is formed on the area other than the concaves/convexes 280 on the light extraction surface that is a surface of the n-type semiconductor layer 241. It is noted that in FIG. 12, examples of the concaves/convexes 280 are schematically shown, and the semiconductor light emitting device 200 includes at least a flat surface (upper surface) among the adjacent concaves to each other, or a flat surface (bottom surface) among the adjacent convexes to each other in the concaves/convexes 280.

Figure 13:
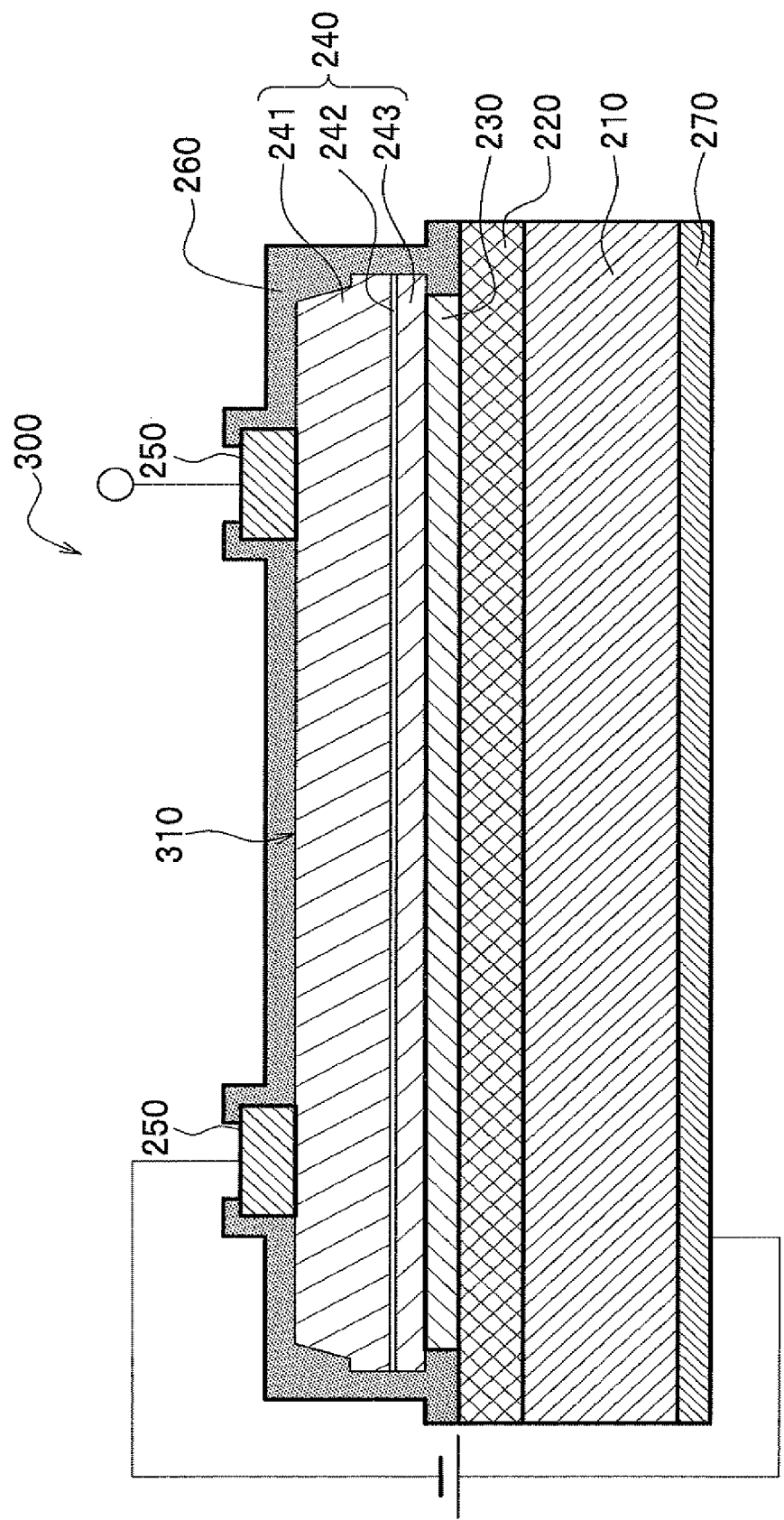
FIG. 13 is a cross sectional view schematically showing a structure of a conventional semiconductor light emitting device.

In the semiconductor light emitting device 200, adhesion strength between the n-electrode 250 and the n-type semiconductor layer 241 is lowered in comparison with that of the semiconductor light emitting device 1 according to the embodiment of the present invention. This was supposed to be caused by damages on the electrode joint portion by the concaves/convexes 280. Then, in order to remove the damages, a semiconductor light emitting device having a flat surface without disposing the concaves/convexes 280 was fabricated (hereinafter, referred to as COMPARATIVE EXAMPLE 2). As shown in FIG. 13, a conventional semiconductor light emitting device 300 that shows the COMPARATIVE EXAMPLE 2 has the same structure with the semiconductor light emitting device 200 shown in FIG. 12 except that a flat surface 310 is formed between the n-electrodes 250 on the light extraction surface that is a surface of the n-type semiconductor layer 241. It was found that adhesion strength of the electrode of the semiconductor light emitting device 300 was improved. Specifically, in the semiconductor light emitting device 200 (COMPARATIVE EXAMPLE 1) shown in FIG. 12, a peeling-off of the n-electrode 250 occurred at a rate of 6% when a wire is bonded on the n-electrode 250. But, in the semiconductor light emitting device 300 (COMPARATIVE EXAMPLE 2) shown in FIG. 13, the peeling-off of the electrode 250 was not observed. However, since the semiconductor light emitting device 300 (COMPARATIVE EXAMPLE 2) shown in FIG. 13 has the flat surface 310, a total light output was decreased.

(Light Distribution)

Figure 8:
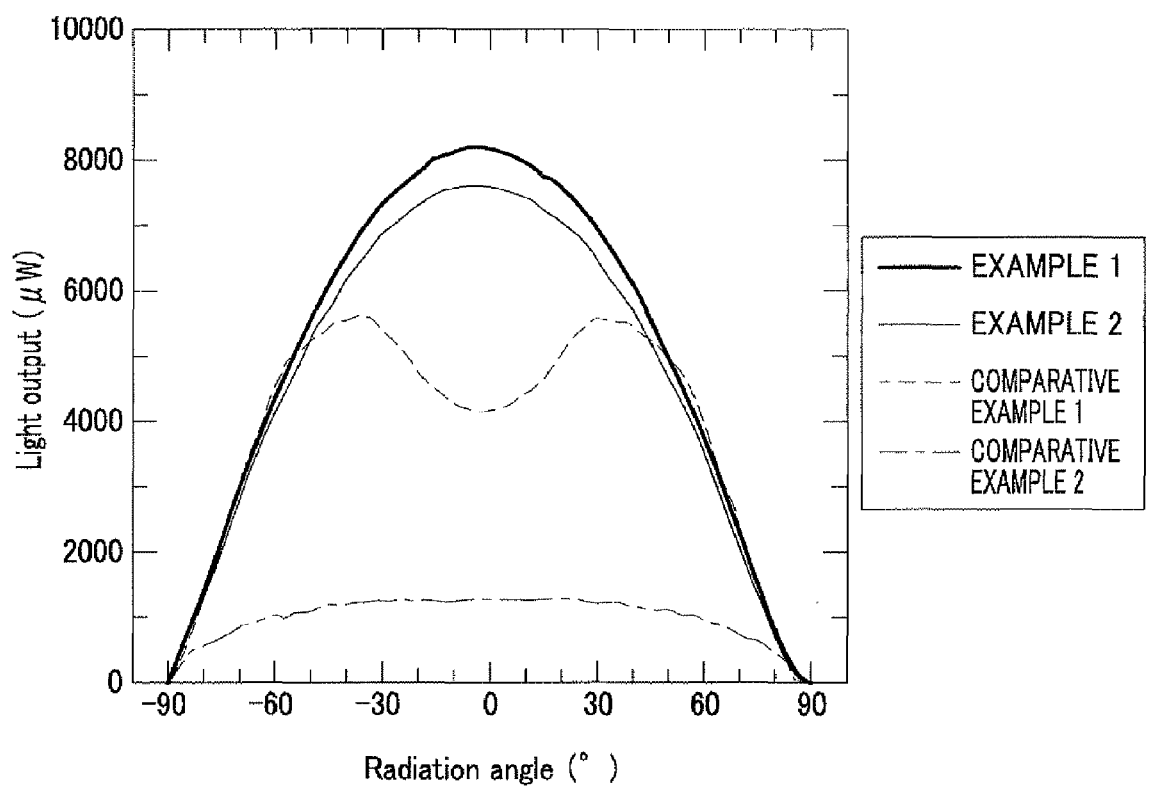
FIG. 8 is a graph showing an example of a light directionality of a semiconductor light emitting device according to the embodiment of the present invention.

FIG. 8 is a graph showing an example of a light directionality of a semiconductor light emitting device according to the embodiment of the present invention. Here, a light output of a semiconductor light emitting device (hereinafter, referred to as EXAMPLE 1) whose first convex area 80 and second convex area 90 were etched using a KOH solution as an etchant for wet-etching is shown with a thick solid line. In addition, a light output of a semiconductor light emitting device (hereinafter, referred to as EXAMPLE 2) where at least a height of the first convex was formed to be lower than that of the EXAMPLE 1 bp adjusting a working amount (depth) is shown with a thin line. Furthermore, a light output of the forgoing COMPARATIVE EXAMPLE 1 is shown with a dashed line, and a light output of the forgoing COMPARATIVE EXAMPLE 2 is shown with a dashed-dotted line.

In FIG. 8, the horizontal axis indicates a radiation angle) (°), and the vertical axis indicates a light output (μW). Here, a directivity angle −90~90° indicates an angle measured in a width direction (lateral direction) of the n-electrode 50 shown in FIG. 2. In the directivity angle defined in the present invention, a direction vertical to the light extraction surface is set to 0 (zero) degree, and a light intensity at each angle of the light extraction direction was measured. For example, in FIG. 2, a direction vertical to the paper surface is directivity angle 0 (zero) degree. As shown in FIG. 8, the EXAMPLE 1 and the EXAMPLE 2 have the largest light output at least at directivity angle 0°. This shows a light distribution according to the Lambert's law, or a light distribution close to the Lambert's law. On the other hand, the COMPARATIVE EXAMPLE 1 has a larger light output at directivity angle ±30° than that of at directivity angle 0°. That is, the semiconductor light emitting device 1 according to the embodiment of the present invention has the light distribution better than that of the conventional semiconductor light emitting device. In addition, a light output of the COMPARATIVE EXAMPLE 2 was decreased totally at any directivity angle. Here, a light output in the light extraction direction corresponds to an area surrounded by each curved line in the graph. Specifically, assuming that a light output of the COMPARATIVE EXAMPLE 2 is "1", a light output of the COMPARATIVE EXAMPLE 1 was "2.57", a light output of the EXAMPLE 1 was "2.70", and a light output of the EXAMPLE 2 was "2.64". Furthermore, with respect to a light intensity at directivity angle 0°, assuming that a light intensity of the COMPARATIVE EXAMPLE 2 is "1", a light intensity of the COMPARATIVE EXAMPLE 1 was "about 3 (about 3 times)" and light intensities of the EXAMPLE 1 and the EXAMPLE 2 were "about 6 (about 6 times)". The light outputs of the EXAMPLE 1 and the EXAMPLE 2 became large due to the large working amount (depth). It is noted that measurement results measured in the vertical direction (longitudinal direction) of the n-electrode 50 shown in FIG. 2 were the same with those of the lateral direction.

In the semiconductor light emitting device 1 according to the embodiment, the first convex area 80 having a relatively high first convex and the second convex area 90 having a relatively low second convex are disposed in the light extraction surface, and the second convex area 90 is arranged closer to the n-electrode 50. As a result, the peeling-off of the n-electrode 50 in the light extraction surface can be reduced. Then, a semiconductor light emitting device which is highly-reliable and which has a high light output can be provided. In addition, according to the semiconductor light emitting device 1 of the embodiment, a semiconductor light emitting device which has a high light distribution and a high light output can be provided. Furthermore, since the second convex is provided on the light extraction surface in addition to the first convex, a current dispersion in the semiconductor layer can be homogenized in comparison with the case where only the first convexes are uniformly disposed.

Figure 9:
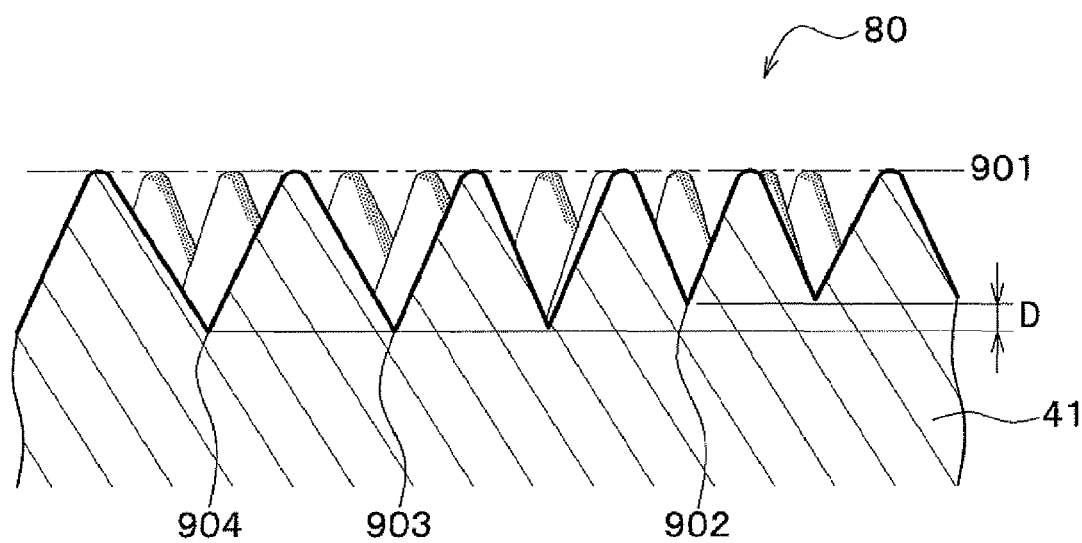
FIG. 9 is a partial cross sectional view schematically showing the first convex area as a modified example of a semiconductor light emitting device according to the embodiment of the present invention.

The embodiment of the present invention has been explained. However, the present invention is not limited to the embodiment and can be embodied in various forms without departing from the sprits of the present invention. For example, in the first convex area 80 on the light extraction surface, a base end of the first convex may be formed to become closer to the light emitting layer 42 as the first convex leaves the n-electrode 50. FIG. 9 is a partial cross sectional view schematically showing the first convex area of a semiconductor light emitting device which is fabricated as described above. Meanwhile, FIG. 9 schematically shows the first convexes observed by (observed by "3D Real Surface View Microscope (VE-9800, manufactured by KEYENCE Corporation)") a scanning electron microscope (SEM). In FIG. 9, it is supposed that the n-electrode 50 (not shown) is arranged on the right. In the example, a top end of each convex has the same height as indicated by a virtual line 901. In addition, in FIG. 9, a cross sectional base end (left side) of the convex at the second from the right and a cross sectional base end (right side) of the convex at the third from the right are neighbored to each other. The common base end is indicated by a reference number 902. A cross sectional base end (right side) 903 of the convex at the fifth from the right and a base end 904 of the convex (left side) are located in the same depth. On the other hand, a position of the base end 904 is deeper than that of the base end 902 by D, assuming that the position of the base end 902 is a standard. Namely, if the convex at the fifth from the right is compared with the convex at the second from the right, the convex at the fifth from the right is formed to be high from a relatively deep level. As described above, even in the first convex area, if the convex is formed to become gradually or continuously deeper as the convex leaves the electrode, the light output can be increased, while reducing the peeling-off of the electrode.

Figure 10:
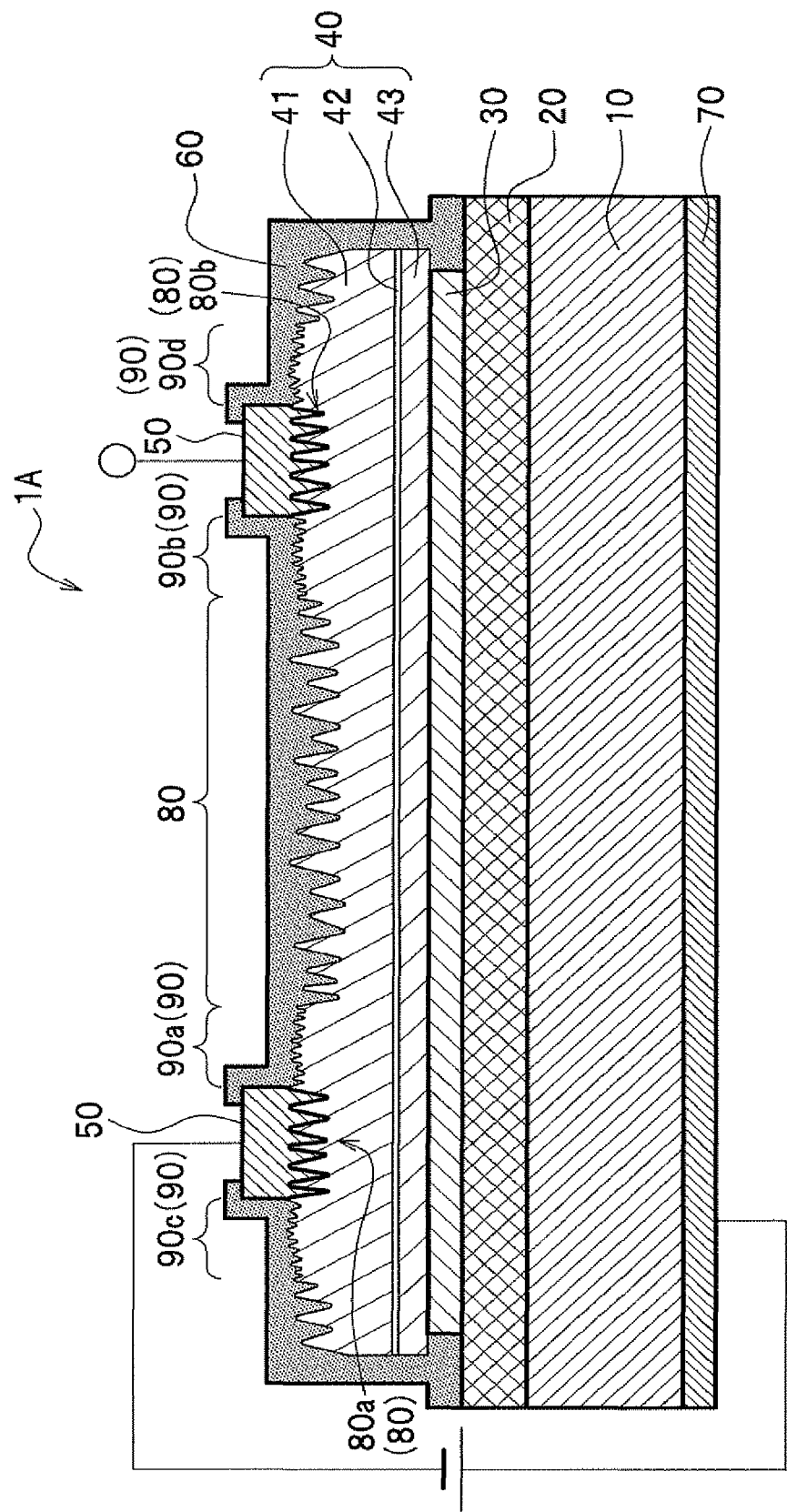
FIG. 10 is a cross sectional view schematically showing a modified example of a structure of a semiconductor light emitting device according to the embodiment of the present invention.

In addition, in the embodiment, after the upper surface (surface of n-type semiconductor layer 41) of the semiconductor stack 40 is polished by CMP, the n-electrode 50 was disposed. However, after the polishing and before forming the n-electrode 50, a convex (first convex) similar to the first convex which will be formed later in the first convex area 80 may be formed in advance by processing the electrode formation planned area. An example of a semiconductor light emitting device which is fabricated as described above is shown in FIG. 10. A semiconductor light emitting device 1A whose cross section is shown in FIG. 10 further has the first convex at the interface between the two n-electrodes 50 and the semiconductor stack 40. That is, first convex areas 80a, 80b are formed just beneath the two n-electrodes 50, respectively. Configuring a semiconductor light emitting device as described above, the adhesiveness between the semiconductor stack 40 and the n-electrode can be improved, thereby resulting in lowering of the contact resistance.

In addition, the first convex area 80 and the second convex area 90 were formed by wet-etching using a mask. However, the method for forming the first convex area 80 and the second convex area 90 is not limited to this and dry-etching may also be used. In the dry-etching, the etching may be conducted so that the first convex area 80 and the second convex area 90 are formed step by step by adjusting etching conditions, such as a gas, a vacuum level and a high frequency power in RIE.

Figure 11:
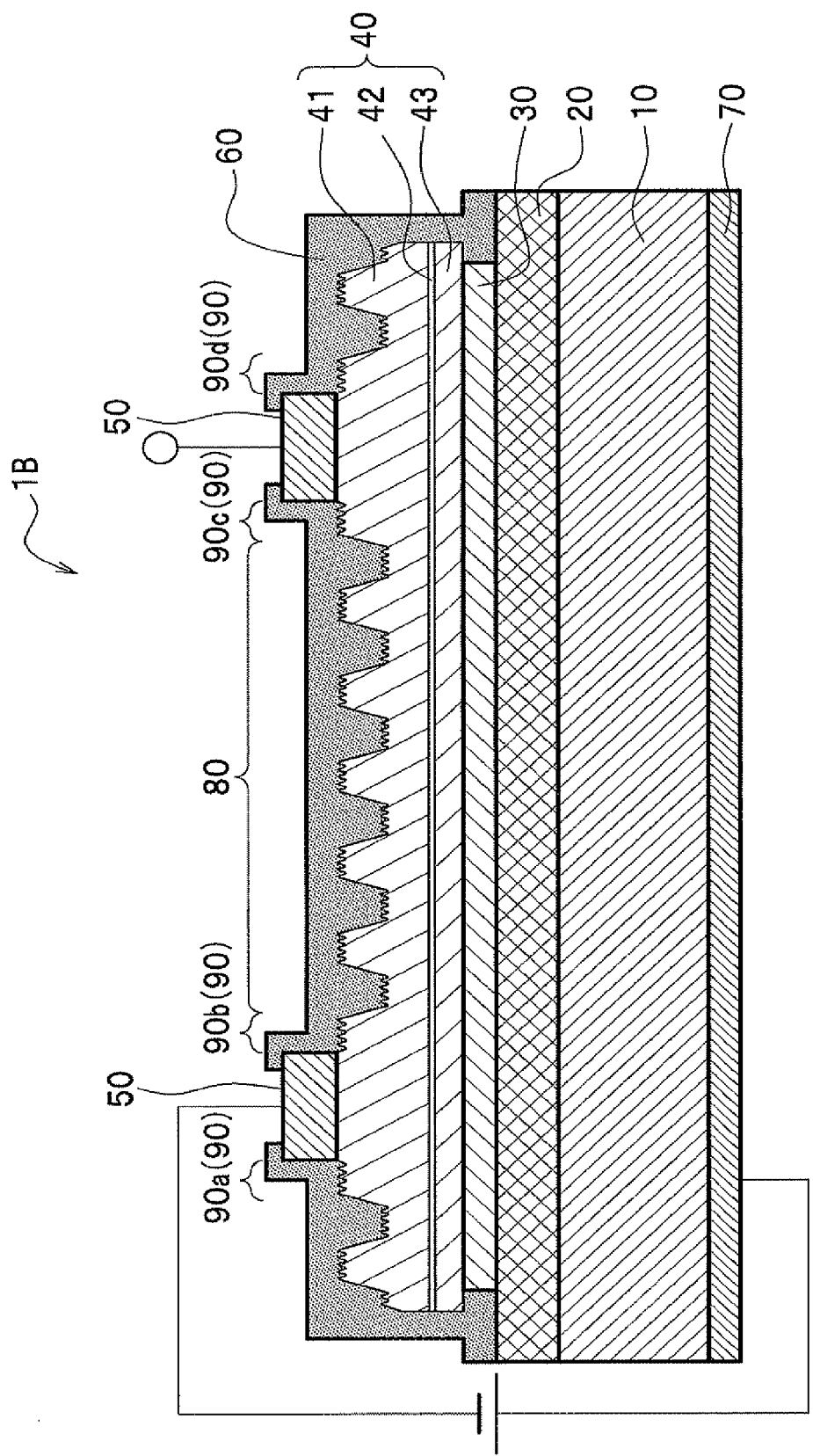
FIG. 11 is a cross sectional view schematically showing a modified example of a structure of a semiconductor light emitting device according to the embodiment of the present invention.

In addition, the first convex area 80 and the second convex area 90 may be formed by a combination of dry-etching and wet etching. An example of a semiconductor light emitting device fabricated as described above is shown in FIG. 11. With respect to a semiconductor light emitting device 1B whose cross section is shown in FIG. 11, first, the first convex area 80 is formed using RIE, next, the second convex area 90 is formed using wet-etching. Here, a cross section of the first convex area 80 may be observed from two points of view. From a first point of view, we can see that in FIG. 11, five convexes which are relatively deep and high are formed in the first convex are 80. From a second point of view, we can see that in FIG. 11, relatively low convexes similar to the convexes formed in the second convex area 90 are formed at a deep level and a shallow level in the first convex area 80. The low convexes can be simultaneously formed in a process for forming the convex in the second convex area 90. According to the semiconductor light emitting device 1B, the second convex area 90 is formed adjacent to the n-electrode 50. Then, the peeling-off of the n-electrode 50 on the light emitting surface can be reduced. In addition, since the relatively deep and high convexes are formed in the first convex area 80, a light emitting device having a high light output can be provided.

In addition, in the embodiment, a light extraction surface of the semiconductor stack 40 was formed on the n-type semiconductor layer 41. However, the light extraction surface of the semiconductor stack 40 may be formed on the p-type semiconductor layer 43, and the first convex area 80 and the second convex area 90 may be formed on the p-type semiconductor layer 43. In this case, a p-electrode is formed on the light extraction surface. Meanwhile, it is preferable to constitute a light emitting device as with the embodiment of the present invention, because the first convex can be deepen in the first convex area 80.

In addition, in the embodiment, the p-electrode 30 was formed on a whole upper surface of the semiconductor stack 40 in the fabrication process (see FIG. 5B). However, the p-electrode 30 may be partially formed on the upper surface of the semiconductor stack 40, and a passivation film identical to that of the passivation film 60 may be filled in an area where the p-electrode 30 is not formed and in the same plane with the p-electrode 30. In this case, it is preferable to form the n-electrode 50 and the p-electrode 30 so that the n-electrode 50 and the p-electrode 30 are alternately arranged in top view of the semiconductor light emitting device 1 as seen from the light extraction surface, for further increasing the light extraction efficiency. Meanwhile, the identical means that, for example, if the passivation film 60 is made of $SiO_2$, the passivation film filled in the area where the p-electrode 30 is not formed is also $SiO_2$, and a small change in composition of the passivation film depending on the formation method may be allowed. A filling of such a passivation film may be conducted by, for example, ECR sputtering.

In addition, a material consisting of the semiconductor stack 40 of the light emitting device 1 is not limited to gallium nitride-based compound semiconductors. In addition, in the embodiment, the second convex area 90 and the first convex area 80 are formed on the light extraction surface in this order from the n-electrode 50, and the convex in the first convex area 80 is formed to be deeper than that in the second convex area 90, that is, the convex is deepened with two steps. However, as long as the convex is formed to be higher from a relatively deep level as each of the areas leaves the electrode, an equivalent advantage will be obtained even if the step is more than three.

In addition, in a semiconductor light emitting device, both the p-electrode 30 and the n-electrode 50 may be disposed on the light extraction surface. In this case, the first convex (or first convex area 80) and the second convex (or second convex area 90) may be disposed on a surface of a semiconductor layer on which an electrode (for example, p-electrode 30) to be disposed on the light emitting layer 42 is formed. If the light emitting device is constituted as described above, there is the advantage to reduce the peeling-off of the electrode disposed on the light emitting layer 42.

INDUSTRIAL APPLICABILITY

A semiconductor light emitting device according to the present invention can be utilized in various fields, for example, lighting, exposure, displays, various kinds of analysis and optical networks.

What is claimed is:

1. A method for fabricating a semiconductor light emitting device, comprising steps of:
   forming a semiconductor stack including a light emitting layer between an n-type semiconductor layer and a p-type semiconductor layer;
   forming a convex on an electrode formation planned area of a light extraction surface of the semiconductor stack;
   forming an electrode on the convex;
   forming a mask which entirely covers an upper surface and a side face of the electrode;
   etching the light extraction surface of the semiconductor stack to form a first convex area having a first convex;
   removing the mask; and
   etching the light extraction surface of the semiconductor stack to form a second convex area having a second convex of which a height is lower than a height of the first convex.

2. The method according to claim 1,
   wherein a base end of the first convex formed in the first convex area is located at a position closer to the light emitting layer than an interface between the electrode and the semiconductor stack in the step of forming the first convex area, and
   wherein a base end of the second convex formed in the second convex area is located at a position closer to the interface between the electrode and the semiconductor stack than the base end of the first convex in the step of forming the second convex area.

3. The method according to claim 1, wherein the second convex area is formed to surround the electrode.

4. The method according to claim 1, wherein the step of forming the semiconductor stack comprises the steps of:
   stacking the n-type semiconductor layer, the light emitting layer and the p-type semiconductor layer in this order on a semiconductor growing substrate; and
   removing the semiconductor growing substrate from the semiconductor stack.

5. The method according to claim 4, wherein the semiconductor growing substrate is made of sapphire.

6. The method according to claim 1, wherein the step of forming the semiconductor stack comprises the steps of:
   stacking the n-type semiconductor layer, the light emitting layer and the p-type semiconductor layer in this order on a semiconductor growing substrate; and
   bonding a substrate and the semiconductor stack before the step of forming the convex on the electrode formation planned area.

7. The method according to claim 6, wherein the semiconductor growing substrate is made of sapphire.

8. The method according to claim 1, wherein the first convex area is formed by dry-etching and the second convex area is formed by wet-etching.

9. The method according to claim 8, wherein the dry-etching is Reactive Ion Etching.

10. The method according to claim 1, wherein the first convex area is formed by a combination of dry-etching and wet-etching.

11. The method according to claim 10, wherein the dry-etching is Reactive Ion Etching.

12. The method according to claim 1, wherein the semiconductor stack is made of compound semiconductor which is expressed by $In_xAl_yGa_{1-x-y}N$,
   wherein $0 \leq x \leq 1$, $0 \leq y \leq 1$, $0 \leq x+y \leq 1$.

* * * * *